(12) United States Patent
Takafuji

(10) Patent No.: US 12,199,035 B2
(45) Date of Patent: Jan. 14, 2025

(54) CHIP-TYPE FUSE

(71) Applicant: Matsuo Electric CO., LTD., Osaka-fu (JP)

(72) Inventor: Yusuke Takafuji, Osaka-fu (JP)

(73) Assignee: Matsuo Electric CO., LTD., Osaka-fu (JP)

( * ) Notice: Subject to any disclaimer, the term of this patent is extended or adjusted under 35 U.S.C. 154(b) by 460 days.

(21) Appl. No.: 17/648,232

(22) Filed: Jan. 18, 2022

(65) Prior Publication Data

US 2022/0262729 A1    Aug. 18, 2022

(30) Foreign Application Priority Data

Feb. 18, 2021   (JP) .................. 2021-24211

(51) Int. Cl.
  *H01L 23/525*    (2006.01)
  *H01H 85/08*    (2006.01)
  *H01H 85/22*    (2006.01)

(52) U.S. Cl.
  CPC ......... *H01L 23/5256* (2013.01); *H01H 85/08* (2013.01); *H01H 85/22* (2013.01)

(58) Field of Classification Search
  CPC .................................................. H01L 23/5256
  See application file for complete search history.

(56) References Cited

U.S. PATENT DOCUMENTS

| | | | |
|---|---|---|---|
| 9,378,917 B2 * | 6/2016 | Yoshida | ............... H01H 85/143 |
| 11,799,266 B2 * | 10/2023 | Tanuma | ............... H01S 5/02216 |
| 2021/0210300 A1 | 7/2021 | Chiu et al. | |

FOREIGN PATENT DOCUMENTS

| | | |
|---|---|---|
| JP | 2005093168 A | 4/2005 |
| JP | 2006244948 A | 9/2006 |
| WO | 9317442 A1 | 9/1993 |

\* cited by examiner

*Primary Examiner* — William C Trapanese
(74) *Attorney, Agent, or Firm* — Duane Morris LLP

(57) ABSTRACT

A chip-type fuse includes a plated-shape fusible body (26). The fusible body (26) has internal electrodes (28 and 30) facing toward the center of the straight line from both ends of the straight line, respectively and has a fusible portion (32) formed between the internal electrodes (28 and 30) and integrated with them. The fusible body is housed into a casing (2). Protrusions (38 and 40) protrude from the parts of the both ends of the internal electrodes (28 and 30). The protrusions (38 and 40) are covered with plating layers (50 and 52).

7 Claims, 4 Drawing Sheets

CHIP-TYPE FUSE

TECHNICAL FIELD

This invention relates to a chip-type fuse and, more particularly, to electrodes thereof.

BACKGROUND ART

An example of prior chip-type fuse is disclosed in International Patent Publication WO1993/17442. The chip-type fuse includes an assembly having a substrate made of a cuboid glass plate. A metal thin film fuse element is formed on an upper face of the substrate. The fuse element has rectangular electrodes on ends of the upper surface of the substrate. A fusible link having a narrower width than that of the electrodes is formed between the electrodes. The fuse element is covered with a silica passivation layer. A cuboid glass cover is bonded to the passivation layer by an epoxy layer. The electrodes are exposed to the both end surfaces of the substrate and the cuboid glass cover. Plating layers such as nickel and chromium cover both end faces of the substrate and the cuboid glass cover, the edges of the lower surface following the end surfaces of the substrate, and the edges of the upper surface of the cover following the end faces of the cuboid glass cover. Solder layers cover the plating layers. The plating layers connect the solder layers and the fuse element.

SUMMARY OF INVENTION

In the above mentioned chip-type fuse, the electrodes integrated with the fusible link are exposed to the both end surfaces of the substrate and the cuboid glass cover and are just in contact with the plating layers on the both end surfaces of the substrate and the cuboid glass cover. Therefore sufficient electrical connection is not obtained between the plating layers and the electrodes.

An object of the present invention is to provide a chip-type fuse in which sufficient electrical electrodes is obtained between plating layers and electrodes, formed in the chip-type fuse.

A chip-type fuse according to an aspect of the present invention includes a plate shaped fusible body. Internal electrodes are arranged at both edges of a straight line in the fusible body. The internal electrodes can be in any shapes. A fusible portion is formed between the internal electrodes. The fusible portion is integrated with the internal electrodes, and is narrower than the internal electrodes. The fusible portion can have one of the various shapes such as a linear shape and a curved shape. The fusible body is placed into a casing. The casing can have one of various shapes into which the fusible body can be placed. In a case the chip-type fuse is a chip-type fuse for a surface mount, it is desirable that at least one surface of the casing is flat. The portions of the internal electrodes located at both ends of the straight line are exposed from the casing. The portions (hereinafter, can be referred to as exposed portions) are covered with conductive layers, respectively. The conductive layers can be formed by plating the exposed portions or by applying conductive coating materials to the exposed portions. The conductive layers can also be extended to other surfaces than the exposed portion in the casing. Protrusions protruding outward from the exposed portions are integrally formed to the exposed portions, respectively. The protrusions are covered with the conductive layers, respectively.

With this arrangement, in the plate-shaped fusible body, the protrusions protrude from the internal electrodes formed integrally with the fusible portion, and the protrusions are covered with the conductive layers, respectively. Therefore sufficient electrical connections are obtained between the each of the internal electrodes and the each of the conductive layers, respectively. If the internal electrodes and the fusible portion are formed by the techniques of coating, it is difficult to form the protrusions protruding from the internal electrodes.

In the aspect, the casing can have concave portions including concave surfaces near both ends of the straight line, parts of the concave surfaces contacting the straight line. In this case the conductive layers are formed on the concave surfaces, respectively and the protrusions protrude from the concave surfaces into the concave portions, respectively.

With this arrangement, the protrusions do not protrude from the concave portions. Therefore, when soldering the chip-type fuse to a printed circuit board, the protrusions do not interfere with the soldering.

Furthermore, the internal electrodes can have recessed surfaces, at least parts of the recessed surface being located in the concave portions of the casing, respectively. In this case, the protrusions are between the recessed surfaces and the concave surfaces, respectively.

With this arrangement, at the same time as forming concave surfaces in the fusible body, it is possible to form portions that become protrusions when the fusible body is placed in the casing. Therefore, the manufacture of this chip-type fuse becomes easy.

Furthermore, the protrusions can be protruded into the concave portions from the entire areas of the concave surfaces seen in theirs plan view, respectively. With this arrangement, the areas of the protrusions can be increased. Therefore more reliable electrical connections between the conductive layers and the internal electrodes, respectively are obtained.

In the aspect of the chip-type fuse, the casing can have at least one flat surface. In this case, the conductive layers are extended to the flat surface, respectively. With this arrangement, the chip-type fuse is one suitable for surface mounting.

In the aspect of the chip-type fuse, The casing can have first and second surfaces of the same shape and spaced parallel to each other. In this case, the casing has a peripheral surface surrounding the periphery of the first and second surfaces and the protrusions protrude from the peripheral surface, respectively. The casing can have, for example, a rectangular parallelepiped shape, a disk shape, an ellipse shape, or bowl-shape.

Furthermore, the casing can have concave surfaces near both ends of the straight line that are partially in contact with the straight line and intersect with the first and second surfaces. In this case, the protrusions protrude from the entire areas of the concave surfaces seen in their plan view, respectively, and the plating layers are formed on all the area of the concave surfaces, respectively With this arrangement, when the chip-type fuse is used for a surface mount, electrical connections between the conductive layers and the internal electrodes, respectively are made very well.

DESCRIPTION OF EMBODIMENTS

Figure 1:
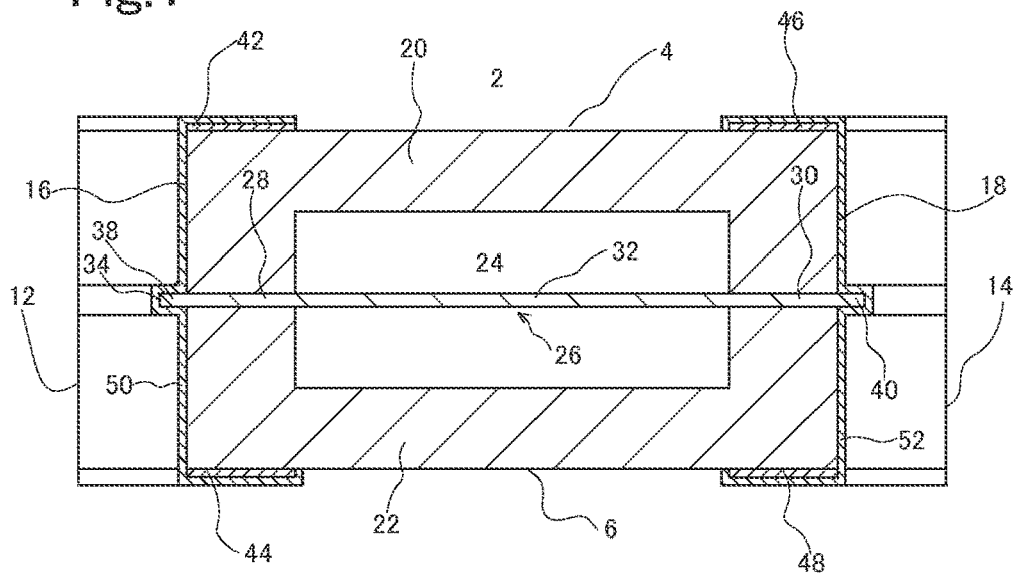
FIG. 1 shows a longitudinal section front view of a chip-type fuse according to a first embodiment of the present invention.
Figure 2:
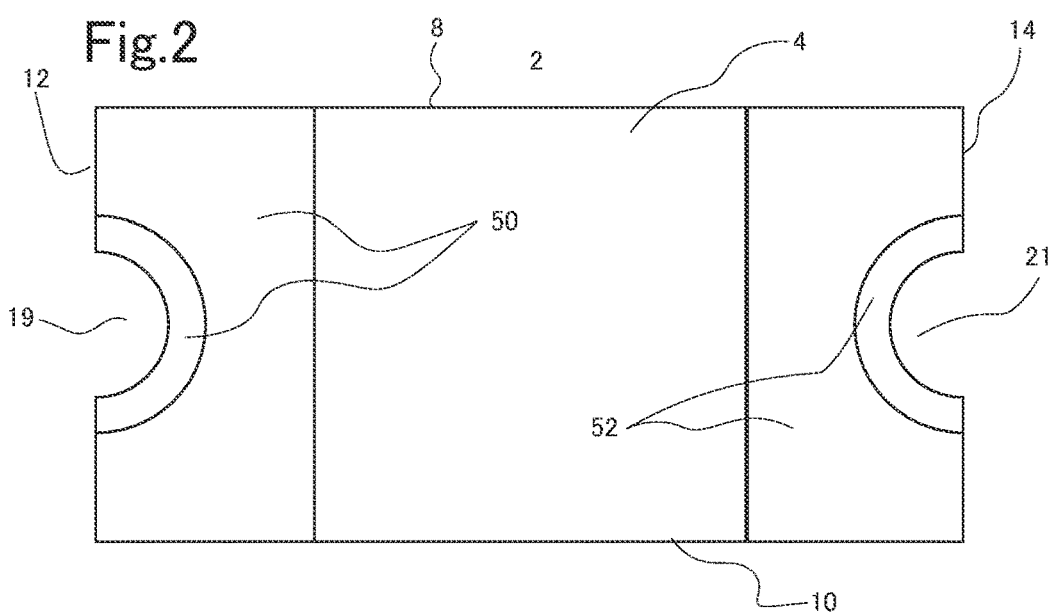
FIG. 2 shows a plan view of a terminal-integrated fuse of the chip-type fuse of FIG. 1.
Figure 3:
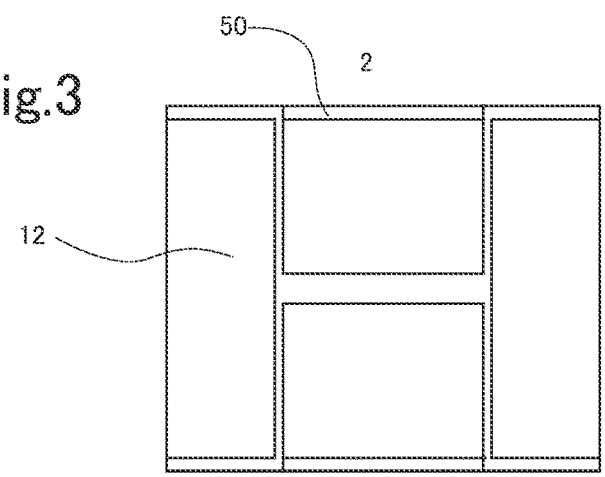
FIG. 3 shows a left side view of the chip-type fuse of FIG. 1.
Figure 4:
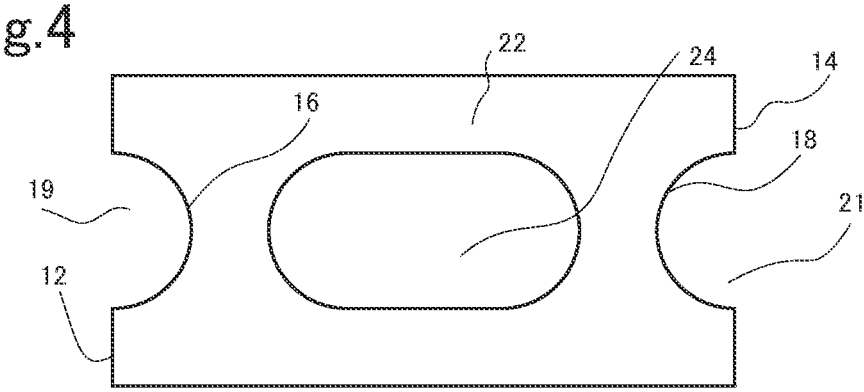
FIG. 4 shows a plan view of the lower casing member of the chip-type fuse of FIG. 1.

A chip-type fuse according to a first embodiment of the present invention includes a casing 2 as shown in FIG. 1-3. For example, the casing 2 is formed in a generally rectangular parallelepiped shape and made of glass epoxy. The casing 2 has a first surface, for example, an upper surface 4 and a second surface, for example, a lower surface 6. The upper surface 4 and the lower surface 6 include the same shapes, for example, rectangular surfaces, placed in parallel so as to be spaced and overlapped each other. The casing 2 has a peripheral surface surrounding the periphery of the first and second surfaces. For example, the peripheral surface includes side surfaces 8 and 10, and end surfaces 12 and 14 which are formed between the upper surface 4 and the lower surface 6. Each of them is rectangular. Concave surfaces 16 and 18 are formed near the center of the line connecting the side surfaces 8 and 10 in the end surface 12 and 14, respectively. The concave surfaces 16 and 18 are formed in the casing 2 inwardly, respectively. Specifically, the concave surfaces 16 and 18 are formed, for example, in arc shapes, specifically in semicircular shapes, by removing parts of the center and near it of the end surfaces 12 and 14, respectively. By forming the concave surfaces 16 and 18 respectively, semi-cylindrical space concave portions 19 and 21 are formed on the end surfaces 12 and 14, respectively. The concave portion 19 is opened in the directions of the upper surface 2, the lower surface 6 and the end face 12, respectively and concave portion 21 is also opened in the directions of the upper surface 12, the lower surface 6 and the end surface 14, respectively. As shown in FIG. 1, the casing 2 is divided into an upper casing member 20 and a lower casing member 22 at the center of the line connecting the upper surface 4 and the lower surface 6 and both members have the same shape. A cavity 24 is formed in the center portion of the inside of the casing 2. The cavity 24 is a long hole in the plan view of FIG. 4.

Figure 5:
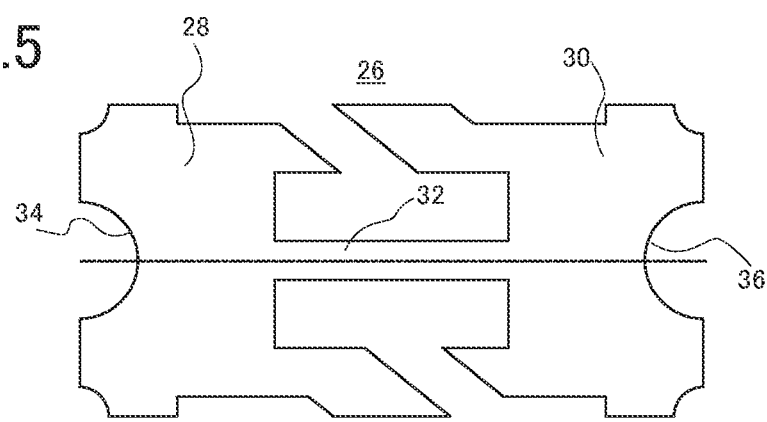
FIG. 5 shows a plan view of the fusible body of the chip-type fuse of FIG. 1
Figure 6:
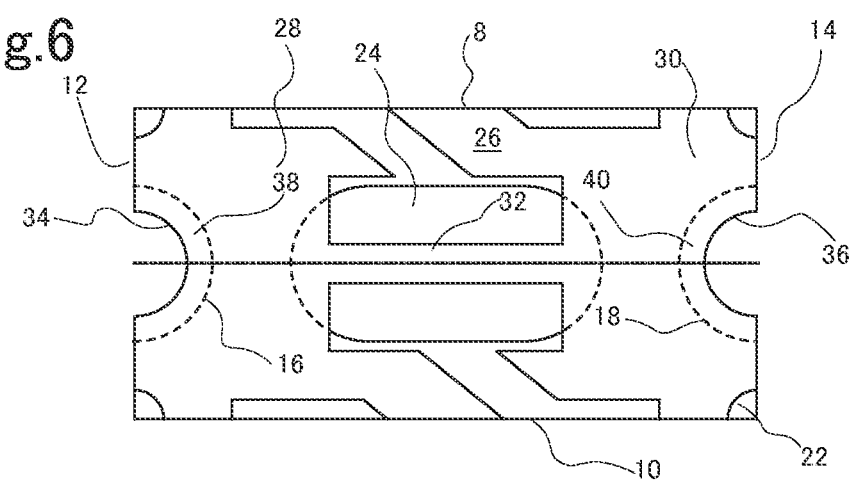
FIG. 6 shows a cross-sectional plan view of the chip type fuse of FIG. 1

As shown in FIG. 1, a fusible body 26 is arranged on a joint surface between the upper casing member 20 and the lower casing member 22. The fusible body 26 includes internal electrodes 28 and 30, and a fusible portion 32 as shown in FIG. 5. As shown in FIG. 6, in the fusible body 26, the internal electrodes 28 and 30 are extended from both ends of a single straight line toward the center of the casing 2, for example, the straight line is located at the center of the end surfaces 12 and 14 and has a length equal to the distance between end surfaces 12 and 14 The internal electrodes 28 and 30 are formed in a substantially rectangular shape having a maximum width equal to the distance between the side surfaces 8 and 10 of the casing 2. The fusible portion 32 is located on the straight line between inner edges of the internal electrodes 28 and 30. The fusible portion 32 is formed to a straight line shape having a width narrower than that of the internal electrodes 28 and 30, and it is located in the cavity 24. The fusible body 26 is a thin metal plate, for example copper plate formed by pressing or etching a thin metal plate, for example a copper plate. In the fusible body 26 the fusible portion 32 is integrated with the internal electrodes 28 and 30.

As shown in FIG. 5, recessed surfaces 34 and 36 are formed on the outer edges of the internal electrodes 28 and 30. The recessed surfaces 34 and 36 have, for example, arc shapes, specifically semicircular shapes, and are recessed toward the center side of the fusible portion 32. As shown in FIG. 6, the fusible body 26 is arranged on the lower casing member 22 so that the end faces 12 and 14 on the lower casing member 22 and the outer edges of the internal electrodes 28 and 30 coincide with each other. In this arrangement, the centers of the recessed surfaces 34 and 36 are on the straight line. The concave surfaces 16 and 18 and the recessed surfaces 34 and 36 are located concentrically with each other, respectively. The radiuses of the recessed surfaces 34 and 36 are formed to be smaller than the radiuses of the concave surfaces 16 and 18. As a result, the recessed surfaces 34 and 36 protrude outward from the concave surfaces 16 and 18, respectively. The portions existing from the recessed surfaces 34 and 36 to the concave surfaces 16 and 18, respectively are referred to as protrusions 38 and 40. As shown in FIG. 6, the protrusions 38 and 40 horizontally protrude into the concave portions 19 and 21 from the entire edges of the recessed surfaces 34 and 36 as seen from theirs plane. If the protrusions 38 and 40 do not exist, the edges of the internal electrodes 28 and 30 on the concave surfaces 16 and 18 are exposed in the concave portions 19 and 21.

Figure 7:
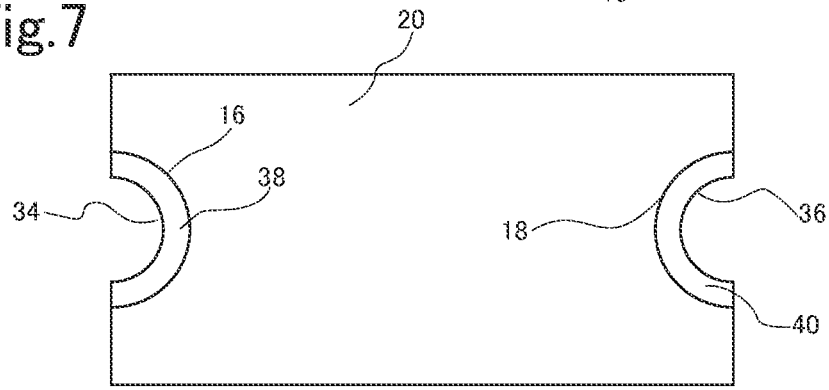
FIG. 7 shows a plan view of the semi-finished product of the chip-type fuse of FIG. 1

In this chip-type fuse, the upper casing member 20, the lower casing member 22 and the fusible body 26 are prepared at first. As shown in FIG. 6, the fusible body 26 is located on the lower casing member 22. As shown in FIG. 7, the lower casing member 22 is covered with the upper casing member 20. The upper casing member 20 and the lower casing member 22 are adhered to each other.

As shown in FIG. 1, conductive layers, for example, external electrodes 42 and 44, are formed on one ends of the upper surface 4 and the lower surface 6 of the casing 2, respectively. The external electrodes 42 and 44 extend from the end surface 12 of the casing 2 to a position beyond the concave surface 16. of the casing 2, have holes at positions corresponding to the concave surface 16 and have the width corresponding to the length from the side surface 8 to the side surface 10 of the casing 2. Similarly, conductive layers, for example, external electrodes 46 and 48 are also formed on the other ends of the upper surface 4 and the lower surface 6 of the casing 2, respectively. The external electrodes 42, 44, 46 and 48 are made of, for example, a copper film.

A conductive layer, for example, a plating layer 50 is formed on the entire concave surface 16 so that all of the protrusion 38 is included in the plating layer 50. A conductive layer, for example, a plating layer 52 also is formed on the entire concave surface 18 so that all of the protrusion 40 is included in the plating layer 52. The plating layers 50 and 52 are extended to the upper surface 4 and the lower surface 6 of the casing 2. The plating layer 50 covers the entire areas of the external electrodes 42 and 44. The plating layer 52 covers the entire areas of the external electrodes 46 and 48. In FIGS. 1 to 3, the plating layers 50 and 52 are shown as one layer for the sake of simplification of the figure, but they are actually composed of a plurality of plating layers such as an electrolytic copper plating layer, an electrolytic copper plating layer, an electrolytic nickel plating layer, and an electrolytic tin plating layer.

In this chip-type fuse, the protrusions 38 and 40 protrude from the internal electrodes 28 and 30 beyond the concave surfaces 16 and 18 into the concave portions 19 and 21, and the entire areas of the protrusions 38 and 40 are covered with the plating layers 50 and 52, respectively. Therefore, the contact area between the protrusion 38 and the plating layer 50 is large so that the electrical connection between them is good, and the contact area between the protrusion 40 and the plating layer 52 is large so that the electrical connection between them is also good. In particular, in this embodiment, since the protrusions 38 and 40 protrude from the entire edges of the concave surfaces 16 and 18, respectively, so that the areas of the protrusions 38 and 40 are large, the contact area between the protrusion 38 and the plating layer 50 and the contact area between the protrusion 40 and the plating layer 52 are further increased. As a result, good electrical connections are reliably made between the protrusion 38 and the plating layer 50, and between the protrusion 40 and the plating layer 52, respectively. The protrusions 38 and 40 are located in the concave portions 19 and 21, respectively, and do not protrude outward from the concave portions 19 and 21, respectively. Therefore, the protrusions 38 and 40 do not hinder the soldering of the chip type fuse to the printed circuit board.

Figure 8:
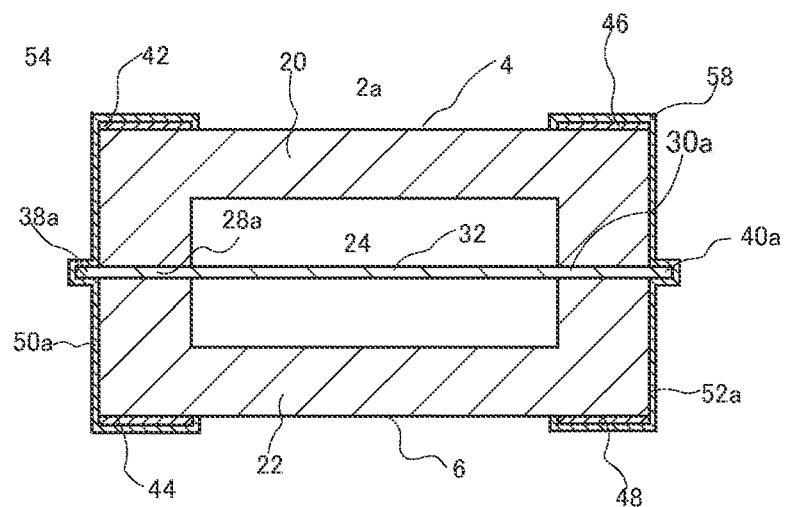
FIG. 8 shows a longitudinal sectional front view of a chip-type fuse according to the second embodiment of the present invention.
Figure 9:
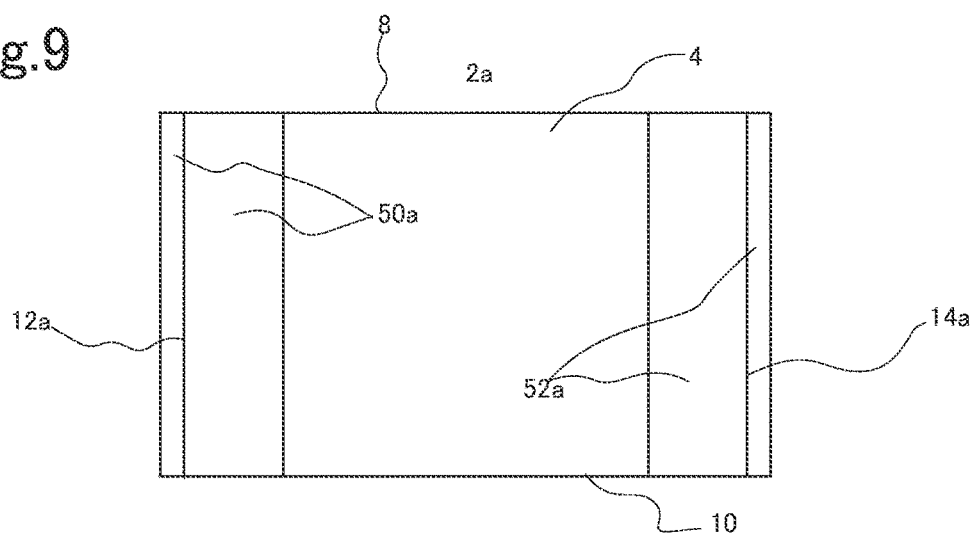
FIG. 9 shows a plan view of the chip-type fuse of FIG. 8.
Figure 10:
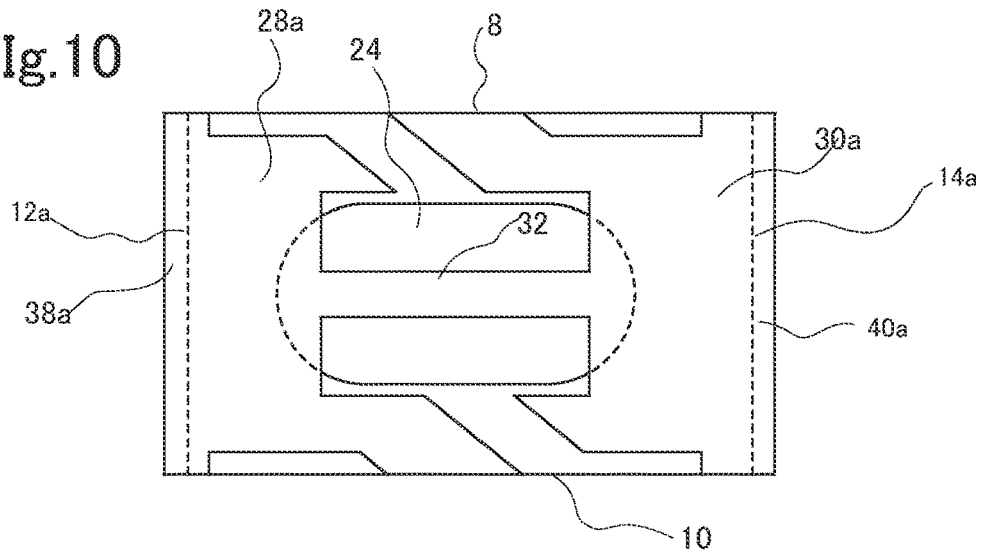
FIG. 10 shows a cross-sectional plan view of the chip-type fuse of FIG. 8.

FIGS. 8-10 show the chip-type fuse of the second embodiment in accordance with the present invention. In the chip-type fuse of this embodiment, the corresponding ones to the concave portions 19 and 21 and the surrounding portions thereof in the chip-type fuse of the first embodiment are removed in a casing 2a, so that the length of the casing 2a is shortened by the amount removed. Along with the removal, internal electrodes 28a and 30a are also formed short so that their outer edges coincide with end surfaces 12a and 14a of the casing 2a as shown in FIG. 10. Protrusions 38a and 40a protrude horizontally and outwardly from the entire outer edge of the internal electrodes 12a and 14a. If the protrusions 38a and 40a are not present, the internal electrodes 28a and 30a are exposed to the end surfaces 12a and 14a. The entire areas of the protrusions 38a and 40a are covered with plating layers 50a and 52a. Since the other configurations are the same as those of the chip-type fuse of the first embodiment, the same reference numerals are given to the equivalent portions, and the description thereof will be omitted. Good electrical connections are reliably made between the protrusion 38a and the plating layer 50a, and between the protrusion 40a and the plating layer 52a respectively.

Figure 11A:
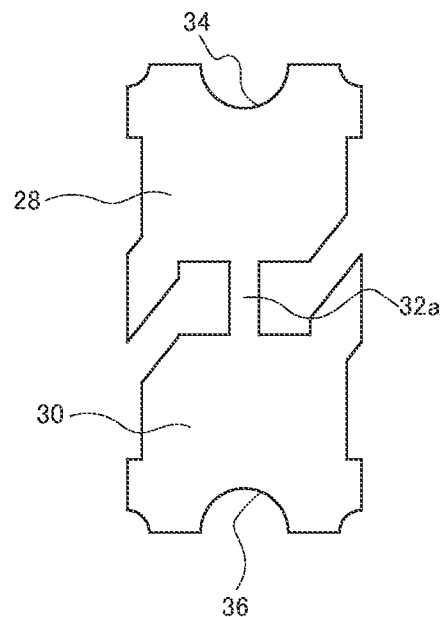
FIG. 11a shows one modification of a fusible body used in the chip-type fuse of the first embodiment.

The chip-type fuses of the above two embodiments can be changed in various ways. For example, in the chip-type fuse of the first embodiment, the length of the fusible portion 32 can be changed according to the fusing characteristics desired in the chip-type fuse. For example, as shown in FIG. 11a, a fusible portion 32b having a length shorter than that of the fusible portion 32 can also be used, a fusible portion curved instead of linear as in the fusible portion 32 of the chip-type fuse of the first embodiment can be used, and a characteristic adjusting section can be provided in the middle of the fusible portion 32. Similarly, in the chip-type fuse of the second embodiment, the fusible portion 32 can be changed.

In the chip-type fuses of the above two embodiments, arc suppressing materials can be attached to the fusible portions 32 and 32a, respectively, and arc suppressing materials can also be poured into the cavity 24 so as to wrap the fusible portions 32 and 32a, respectively.

Figure 11B:
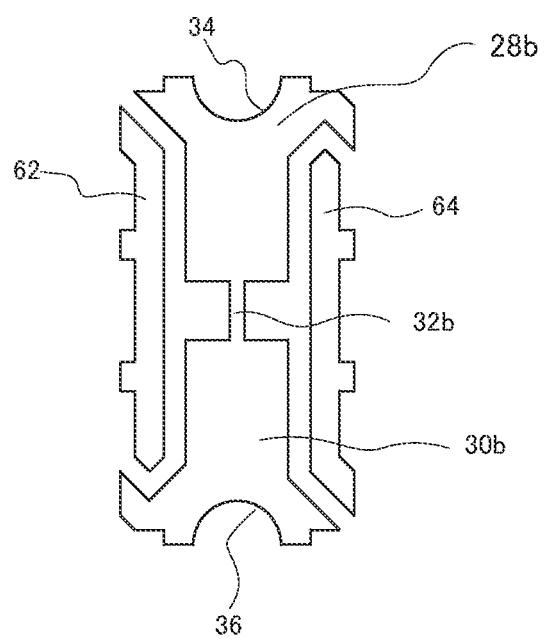
FIG. 11b shows the other modification of the fusible body used in the chip-type fuse of the first embodiment.

It is possible that as shown in FIG. 11b, the widths of the internal electrodes 28b and 30b are made narrower than those of the internal electrodes 28 and 30 of the first embodiment so as to form spaces in the sides of the side surfaces 8 and 10 of the casing 2, respectively and reinforcing patterns 62 and 64 independent of the internal electrodes 28b and 30b are installed in the spaces, respectively. The provision of the reinforcing patterns 62 and 64 enhances the strength of the casing 2. The reinforcing patterns 62 and 64 can be formed from the metal at the same time when the fusible body 26 is formed by pressing or etching the metal, reinforcing patterns can be similarly provided in the chip-type fuse of the second embodiment.

In the chip-type fuses of the above two embodiments, the plating layers 50, 52, 50a and 52a are used as the conductive layers, but layers of conductive paint layers can be used instead of the plating layers 50, 52, 50a and 52a. Specially in the chip-type fuse of the first embodiment, the conductive paint layers can be provided in the entire areas of the concave portions 19 and 21, respectively.

In the chip-type fuses of the above two embodiments, the casing 2 and 2a have rectangular parallelepiped shapes but they can have the other shapes, for example, disk-shapes, elliptical plate shapes, or bowl-shapes In the chip-type fuses of the above two embodiments, the external electrodes 42 and 46 are provided on the upper surfaces of the casings 2 and 2a and the external electrodes 44 and 48 are provided on the lower surface of them, but only the external electrodes 44 and 48 can be provided on the lower surface of them. In these cases, the plating layers 50 can be formed so as to cover the protrusion 38 and the external electrode 44, and the plating layer 52 can be formed so as to cover the protrusion 40 and the external electrode 48, similarly the plating layers 50a can be formed so as to cover the protrusion 38a and the external electrode 44, and the plating layer 52a may be formed so as to cover the protrusion 40a and the external electrode 48

In the chip-type fuse of the first embodiment, the concave surfaces 16 and 18 and the concave surfaces 34 and 36 have semicircular shapes, but the shapes are not limited to such shapes, they can be, for example, U-shapes, channel-shapes, or V-shapes.

In the chip-type fuse of the first embodiment, the protrusions 38 and 40 are protruded from the entire areas of the concave surfaces 16 and 18, respectively, but the protrusions 38 and 40 can also be protruded from parts of the concave surfaces 16 and 18, respectively. Similarly, in the second embodiment, the protrusions 38a and 40a are protruded from the entire outer edges of the internal electrodes 28a and 30a, respectively, but can be protruded from only parts thereof. In the chip type fuses of the above two embodiments, the entire regions in the protrusions 38, 40, 38a, and 40a protrude horizontally, respectively, but for example, the tips of the protrusions 38, 40, 38a and 40a can be bent toward the upper surface 4 or the lower surface 6 of the cases 2 and 2a. In these cases, the plating layers 50, 50a, 52 and 52a are provided so as to cover the bent portions.

The invention claimed is:

1. A chip-type fuse comprising:

plate-shaped fusible body including internal electrodes located on and at both ends of a straight line, respectively and a fusible portion located between said internal electrodes, said fusible portion being integrated with said internal electrodes and narrower than said internal electrodes;

a casing housing said fusible body therein, exposed portions of said internal electrodes located on and at both ends of said straight line being exposed from said casing, respectively; and conductive layers formed so as to cover the exposed portions of said internal electrodes on said casing, wherein protrusions protrude from said exposed portions on and along extension lines of the straight line and integrated with said exposed portions, respectively, and are covered with said conductive layers, respectively.

2. The chip-type fuse according to claim 1, wherein said casing has concave portions including concave surfaces, said concave surfaces are located near the both ends of said straight line and parts of said concave surfaces contact said straight line, said conductive layers are formed on said concave surfaces, said protrusions protrude from said concave surfaces into said concave portions.

3. The chip-type fuse according to claim 2, wherein said internal electrodes have recess surfaces, each of at least part of the recess surface is located in said concave portion, respectively, and each of said protrusion exists between said recess surface and said concave surface.

4. The chip-type fuse according to claim 3, wherein said protrusions are formed over the entire area of said recessed surfaces, respectively.

5. The chip-type fuse according to claim 1, wherein said casing has at least one flat surface, said conductive layers extend on said flat surface.

6. The chip-type fuse according to claim 1, wherein said casing has first and second surfaces including the same shape and spaced parallel to each other, and has a peripheral surface surrounding said periphery of said first and second surfaces and said protrusions protrude from said peripheral surface.

7. The chip-type fuse according to claim 6, wherein said casing includes concave surfaces provided at both ends of the straight line, respectively, said concave surfaces are recessed from said peripheral surface toward the inside of said casing, and said concave surfaces are open on said first and second surfaces, and parts of the concave surfaces contact the straight line, protrusions protrude over entire areas of said concave surfaces when viewed from the first and second surface sides, and said plating layers are formed on the entire area of the concave surfaces, respectively.

* * * * *